United States Patent
Zhang et al.

(10) Patent No.: US 9,791,789 B2
(45) Date of Patent: Oct. 17, 2017

(54) MAGNETICALLY SUSPENDED COARSE MOTION AND FINE MOTION INTEGRATED RETICLE STAGE DRIVEN BY PLANAR MOTOR

(71) Applicants: TSINGHUA UNIVERSITY, Beijing (CN); BEIJING U-PRECISION TECH CO., LTD., Beijing (CN)

(72) Inventors: Ming Zhang, Beijing (CN); Yu Zhu, Beijing (CN); Fan Zhi, Beijing (CN); Rong Cheng, Beijing (CN); Kaiming Yang, Beijing (CN); Zhao Liu, Beijing (CN); Li Zhang, Beijing (CN); Huichao Qin, Beijing (CN); Yanpo Zhao, Beijing (CN); Li Tian, Beijing (CN); Weinan Ye, Beijing (CN); Jin Zhang, Beijing (CN); Wensheng Yin, Beijing (CN); Haihua Mu, Beijing (CN); Jinchun Hu, Beijing (CN)

(73) Assignees: TSINGHUA UNIVERSITY, Beijing (CN); BEIJING U-PRECISION TECH CO., LTD., Beijing (CN)

( * ) Notice: Subject to any disclaimer, the term of this patent is extended or adjusted under 35 U.S.C. 154(b) by 0 days.

(21) Appl. No.: 15/307,797

(22) PCT Filed: Apr. 17, 2015

(86) PCT No.: PCT/CN2015/076880
§ 371 (c)(1),
(2) Date: Oct. 28, 2016

(87) PCT Pub. No.: WO2015/165335
PCT Pub. Date: Nov. 5, 2015

(65) Prior Publication Data
US 2017/0052461 A1    Feb. 23, 2017

(30) Foreign Application Priority Data

Apr. 28, 2014 (CN) .......................... 2014 1 0174870

(51) Int. Cl.
*G03F 7/20* (2006.01)

(52) U.S. Cl.
CPC ............ *G03F 7/70758* (2013.01); *G03F 7/20* (2013.01); *G03F 7/70716* (2013.01); *G03F 7/70766* (2013.01); *G03F 7/70775* (2013.01)

(58) Field of Classification Search
CPC .. G03F 7/70341; G03F 7/707; G03F 7/70716; G03F 7/70875
See application file for complete search history.

(56) References Cited

U.S. PATENT DOCUMENTS 6,426,788 B1    7/2002  Korenaga
2006/0285092 A1*  12/2006  Ono .................. G03F 7/70266
                                                    355/30

FOREIGN PATENT DOCUMENTS

CN    201097109 Y    8/2008
CN    102096338 A    6/2011
(Continued)

OTHER PUBLICATIONS

International Search Report for International Patent Application No. PCT/CN2015/076880, filed Apr. 17, 2015.

*Primary Examiner* — Michelle M Iacoletti

(57) ABSTRACT

A magnetically suspended coarse motion and fine motion integrated reticle stage driven by a planar motor comprises a movable platform (100), a balance mass (200), a drive motor, a mask plate (101), a base (001), a vibration isolation system (500), and a measuring system, wherein, the vibration isolation system is located between the balance mass and the base, and the mask plate is mounted on the movable platform. The drive motor of the movable platform is a (Continued)

moving-iron type planar motor (300). The reticle stage can lower the design complexity of the drive motor of the movable platform. Compared with a linear motor, the planar motor can provide push forces in more directions, the number of motors is reduced, the structure of the movable platform is more compact, the inherent frequency and the control bandwidth of the movable platform are improved, and thus control precision is improved.

4 Claims, 3 Drawing Sheets

(56) References Cited

FOREIGN PATENT DOCUMENTS

| | | |
|---|---|---|
| CN | 103454864 A | 12/2013 |
| CN | 203838475 U | 9/2014 |
| CN | 104122759 A | 10/2014 |
| EP | 0768705 A2 | 4/1997 |

\* cited by examiner

MAGNETICALLY SUSPENDED COARSE MOTION AND FINE MOTION INTEGRATED RETICLE STAGE DRIVEN BY PLANAR MOTOR

This application is a U.S. National Stage Application of International Patent Application No. PCT/CN2015/076880, filed on Apr. 17, 2015, which claims priority from and the benefit under 35 U.S.C. §119(a) of Chinese Patent Application No. 201410174870.0, filed on Apr. 28, 2014, which is hereby incorporated by reference for all purposes as if fully set forth herein.

TECHNICAL FIELD

The present invention relates to a magnetically suspended coarse motion and fine motion integrated reticle stage driven by a planar motor, more particularly, to a magnetically suspended coarse motion and fine motion integrated reticle stage driven by a moving-iron type planar motor, and the reticle stage is mainly applied to the technical field of semiconductor fabrication.

BACKGROUND ART

In the past several decades, the development of semiconductor industry is driven by the Moore's law. That is, with the same price, the number of transistors in an integrated circuit doubles approximately every 18 months, and the performance of the integrated circuit doubles as well. This requires smaller and smaller feature size of the chip. In view of technology, as the increase of circuit density on silicon wafer, its complexity and error rate will grow exponentially, which requires higher and higher accuracy for a new generation of lithography machine.

The resolution of the lithography machine may be improved by decreasing the wavelength of light source, reducing process factors and increasing the numerical apertures of optical components. The variation ranges of the process factors and the numerical apertures of optical components are very small, and the resolution of the lithography machine and the accuracy of the lithography machine may be improved to a larger degree by decreasing the wavelength of light source. The wavelength of light source in the lithography machine is developed from ultraviolet (UV) light of 365 nm to deep ultraviolet (DUV) light of 248 nm and 193 nm, and the resolution of the lithography machine is improved in each stage. An extreme ultraviolet (EUV) light with a wavelength of 13.5 nm will be used as the light source in the next generation of lithography machines.

A projection objective system, an alignment system and a super-precise workpiece stage system are three core technologies in the lithography machine. Wherein, the super-precise workpiece stage system comprises a reticle stage system for supporting mask plates and a silicon wafer stage system for supporting silicon wafers.

As EUV photons may be absorbed by gas, the silicon wafers should be exposed in a vacuum cavity. The wavelength of the light source may be influenced by temperature, thereby affecting the accuracy. Thus, the power consumption of the system should be minimized to ensure stable ambient temperature, and the components used in vacuum must be made from materials with the fewest gas evolution. A magnetically suspended reticle stage is the optimum solution for meeting the requirements on power consumption and vacuum. The magnetic suspension support has the following advantages of smaller temperature rise, zero friction and attrition under ultra-high speed, no creep under ultra-low speed, higher motion accuracy, smaller vibration, and no contamination.

The reticle stage system consists of a movable platform of the reticle stage, a balance mass, a drive motor for the movable platform, a mask plate, a base, a vibration isolation system, a measurement system and the like. The exposure process of the lithography machine requires that the drive motor drives the movable platform carrying the mask plate to move to and fro in an "acceleration—uniform velocity—deceleration" movement in a large stroke (>132 mm) along a scanning direction, and to move in a fine motion (±2 mm) with other degrees of freedom. Based on the structures of the movable platforms of the reticle stages, the reticle stages may be divided into two types, i.e., a reticle stage with a movable platform utilizing a coarse motion and fine motion laminated structure, and a reticle stage with a movable platform utilizing a coarse motion and fine motion integrated structure. As for the reticle stage utilizing the coarse motion and fine motion laminated structure, the movable platform of the reticle stage consists of a coarse movable platform which can achieve large stroke movement, and a micropositioner which can achieve high precision fine adjustment. As for the reticle stage utilizing the coarse motion and fine motion integrated structure, the large stroke movement and the high precision fine adjustment are achieved by an individual movable platform of a coarse motion and fine motion integrated reticle stage.

The movable platform utilizing the coarse motion and fine motion integrated structure has features of lighter mass, less cable perturbation and the like, and advantages of less power consumption during the operation of the reticle stage, lower requirement on thrusts of the motors and more accurate theoretical model, some scholars have carried out research on it. In prior art, the six degrees of freedom movement of the movable platform of a magnetically suspended coarse motion and fine motion integrated reticle stage is achieved by linear motors, and each of the linear motors may provide a thrust in the movement direction of the mover of the motor and a thrust in a direction perpendicular to the movement direction of the mover of the motor. In order to control the leveling movement and focusing movement of the movable platform of the coarse motion and fine motion integrated reticle stage, at least three linear motors are required to provide the thrusts in a vertical direction. In order to control the six degrees of freedom movement of the movable platform of the coarse motion and fine motion integrated reticle stage, at least another two linear motors are required, which provide thrusts in a different direction from that of the aforementioned linear motors. Due to structural restrictions, the two kinds of motors are different in structure, which increases the design complexity of the drive motors for the movable platform of the coarse motion and fine motion integrated reticle stage. The two kinds of linear motors with different structures are arranged on the movable platform of the coarse motion and fine motion integrated reticle stage in parallel, so that the width of the movable platform of the coarse motion and fine motion integrated reticle stage is increased, and the natural frequency and the control bandwidth of the movable platform of the coarse motion and fine motion integrated reticle stage are reduced, thereby influencing the control precision.

SUMMARY

An objective of the present invention is to provide a magnetically suspended coarse motion and fine motion integrated reticle stage driven by a planar motor, which is aimed at solving the problem of the design complexity of the drive motors for the movable platform of the reticle stage due to the use of linear motors in the prior art, which problem increases the width of the movable platform of the coarse motion and fine motion integrated reticle stage, and reduces the natural frequency and the control bandwidth of the movable platform of the coarse motion and fine motion integrated reticle stage, thereby influencing the control precision.

The technical solutions of the present invention are described below.

The present invention provides a magnetically suspended coarse motion and fine motion integrated reticle stage driven by a planar motor, the reticle stage comprises a movable platform of the coarse motion and fine motion integrated reticle stage, a balance mass, a drive motor for the movable platform of the coarse motion and fine motion integrated reticle stage, a mask plate, a base, a vibration isolation system, and a measurement system, wherein, the vibration isolation system is located between the balance mass and the base, and the mask plate is mounted on the movable platform of the coarse motion and fine motion integrated reticle stage, wherein, the drive motor for the movable platform of the coarse motion and fine motion integrated reticle stage is a moving-iron type planar motor, a mover of the moving-iron type planar motor is a permanent magnet array mounted on a top surface of the movable platform of the coarse motion and fine motion integrated reticle stage, and a stator of the moving-iron type planar motor is a coil array mounted on the balance mass.

The magnetically suspended coarse motion and fine motion integrated reticle stage driven by the planar motor provided by the present invention further comprises a magnetic suspension structure for providing a compensation for a gravity of the movable platform of the coarse motion and fine motion integrated reticle stage, a mover of the magnetic suspension structure is mounted on the movable platform of the coarse motion and fine motion integrated reticle stage, and a stator of the magnetic suspension structure is mounted on the balance mass.

In the magnetically suspended coarse motion and fine motion integrated reticle stage provided by the present invention, the permanent magnet array of the mover of the moving-iron type planar motor is arranged in a two-dimension Halbach array, and coils of the coil array of the stator of the moving-iron type planar motor are arranged in two directions, i.e., in Y direction and X direction.

The magnetically suspended coarse motion and fine motion integrated reticle stage provided by the present invention utilizes a reflection-type mask plate, the movable platform of the coarse motion and fine motion integrated reticle stage has a solid structure, and the mask plate is arranged at a bottom of the movable platform of the coarse motion and fine motion integrated reticle stage.

Compared with the prior art, the present invention has the following advantages and prominent technical effects: (1) the magnetically suspended coarse motion and fine motion integrated reticle stage provided by the present invention achieves the six degrees of freedom movement of the movable platform of the coarse motion and fine motion integrated reticle stage by using the moving-iron type planar motor with a single structure, which can reduce the design complexity of the motors for the movable platform of the coarse motion and fine motion integrated reticle stage; compared with a linear motor, the planar motor can provide thrusts in more directions, so that the number of the motors is reduced, the structure of the movable platform of the coarse motion and fine motion integrated reticle stage is more compact, and the natural frequency and the control bandwidth of the movable platform of the coarse motion and fine motion integrated reticle stage are improved, and thus the control precision is improved. (2) The magnetic suspension gravity compensation structure can reduce the power consumption during the operation of the system, attenuate the influence of the heat generated by the system on the ambient and the measurement system, and improve the control precision.

BRIEF DESCRIPTION OF THE DRAWINGS

FIG. 5b is a section view taken along line A-A in FIG. 5a.

In the drawings:

100-movable platform of the coarse motion and fine motion integrated reticle stage, 101-mask plate, 200-balance mass, 300-moving-iron type planar motor, 301-mover of the moving-iron type planar motor, 302-stator of the moving-iron type planar motor, 400-magnetic suspension structure, 401-mover of the magnetic suspension structure, 402-stator of the magnetic suspension structure, 500-vibration isolation system.

DETAILED DESCRIPTION OF EMBODIMENTS

Hereinafter, the principle, structure and implementation of the present invention are further explained in detail in connection with the accompanying drawings.

Figure 1:
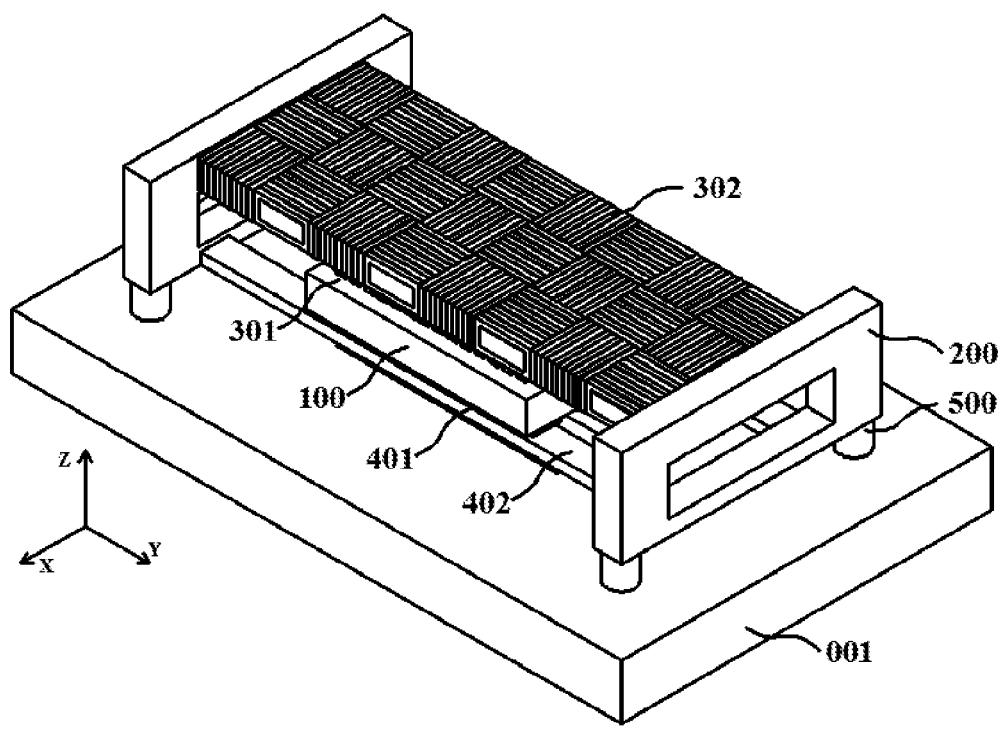
FIG. 1 is an isometric view illustrating the structure of the magnetically suspended coarse motion and fine motion integrated reticle stage driven by the planar motor according to the present invention.
Figure 2:
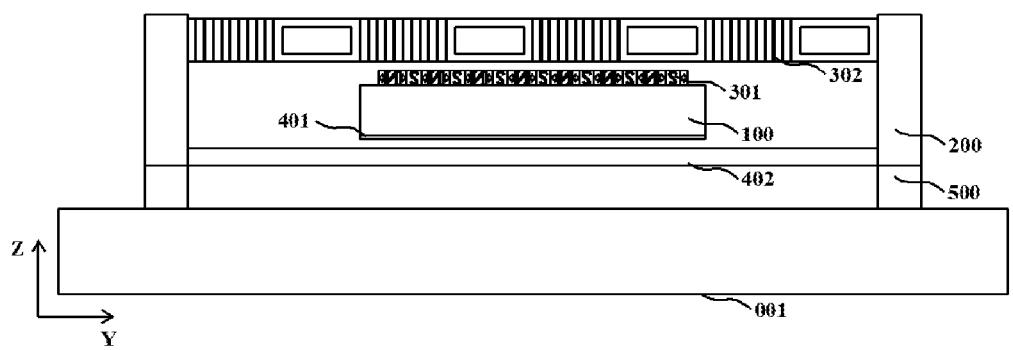
FIG. 2 is a front view illustrating the structure of the magnetically suspended coarse motion and fine motion integrated reticle stage driven by the planar motor according to the present invention.

FIG. 1 and FIG. 2 are an isometric view and a front view illustrating the structure of the magnetically suspended coarse motion and fine motion integrated reticle stage driven by the planar motor provided by the present invention, respectively. The magnetically suspended coarse motion and fine motion integrated reticle stage driven by the planar motor comprises a movable platform 100 of the coarse motion and fine motion integrated reticle stage, a balance mass 200, a drive motor for the movable platform of the coarse motion and fine motion integrated reticle stage, a mask plate 101, a base 001, a vibration isolation system 500, and a measurement system. The vibration isolation system 500 is located between the balance mass 200 and the base 001, and the mask plate 101 is mounted on the movable platform 100 of the coarse motion and fine motion integrated reticle stage. The drive motor for the movable platform of the coarse motion and fine motion integrated reticle stage employs a moving-iron type planar motor 300, a mover 301 of the moving-iron type planar motor is a permanent magnet array mounted on a top surface of the movable platform 100 of the coarse motion and fine motion integrated reticle stage, and a stator 302 of the moving-iron type planar motor is a coil array mounted on the balance mass 200. The six degrees of freedom movement (a large stroke movement in Y direction, and other five degrees of freedom fine adjustment of the movable platform of the coarse motion and fine motion integrated reticle stage) of the movable platform 100 of the coarse motion and fine motion integrated reticle stage is achieved by the moving-iron type planar motor 300 (permanent magnet array) provided on the top surface of the movable platform of the coarse motion and fine motion integrated reticle stage.

The coarse motion and fine motion integrated reticle stage provided by the present invention further comprises a magnetic suspension structure 400 for providing compensation for the gravity of the movable platform of the coarse motion and fine motion integrated reticle stage, and thus the vertical force provided by the magnetic suspension structure 400 compensates the gravity of the movable platform of the coarse motion and fine motion integrated reticle stage. The mover 401 of the magnetic suspension structure is mounted on the movable platform of the coarse motion and fine motion integrated reticle stage, and the stator 402 of magnetic suspension structure is mounted on the balance mass, wherein, when the stator 402 of magnetic suspension structure is arranged above the movable platform 100 of the coarse motion and fine motion integrated reticle stage, the stator provides a vertical upward attraction for the movable platform 100 of the coarse motion and fine motion integrated reticle stage; when the stator 402 of magnetic suspension structure is arranged below the movable platform 100 of the coarse motion and fine motion integrated reticle stage, the stator provides a vertical upward repulsion; and when the stators 402 of magnetic suspension structure are arranged above and below the movable platform 100 of the coarse motion and fine motion integrated reticle stage respectively, the stators provide a vertical upward resultant force.

Figure 3:
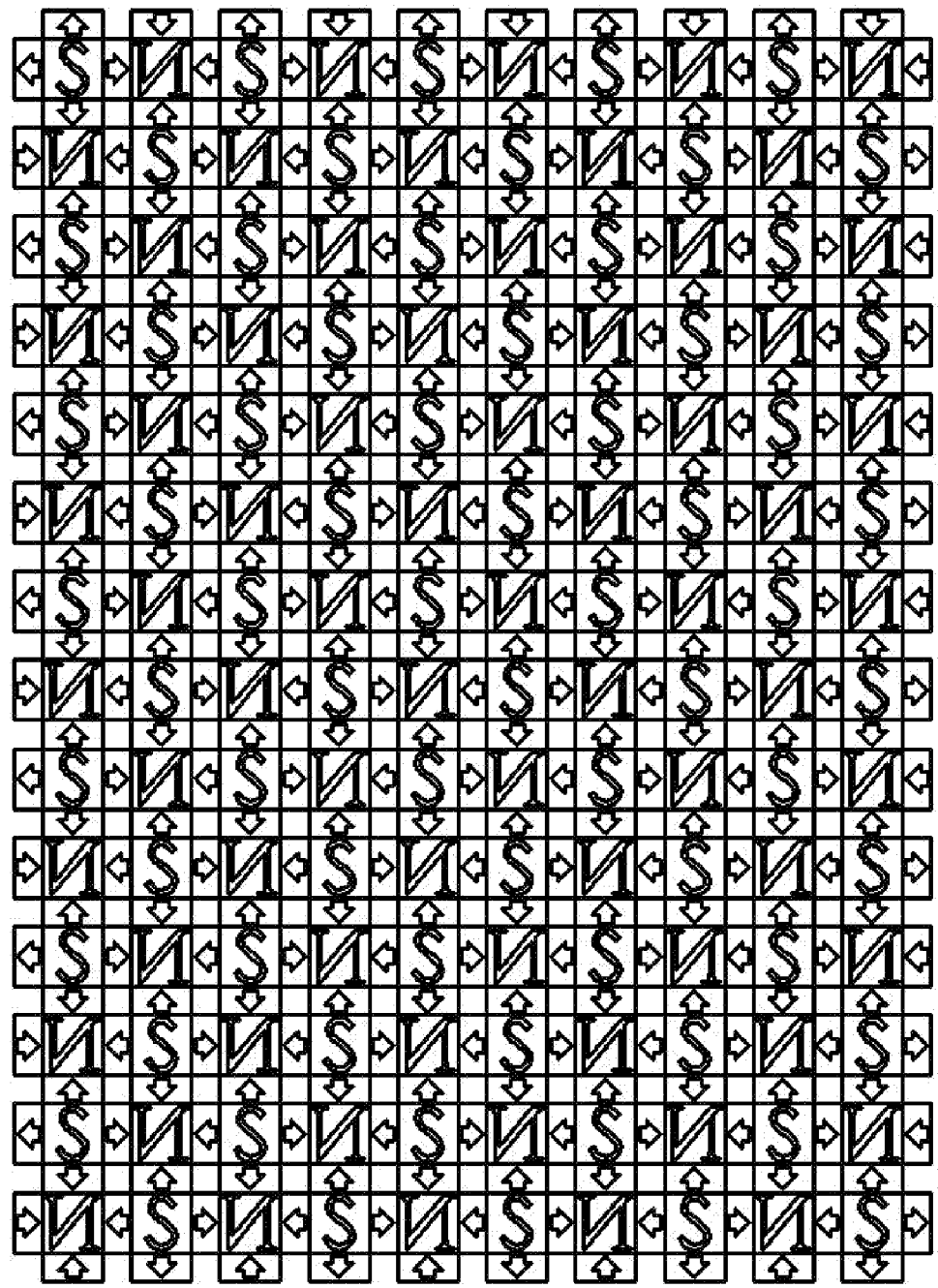
FIG. 3 is a diagram illustrating the arrangement of the permanent magnet array of the mover of the moving-iron type planar motor according to the present invention.

FIG. 3 shows the mover 301 of the moving-iron type planar motor of the present invention, and the mover is a permanent magnet array mounted on the movable platform 100 of the coarse motion and fine motion integrated reticle stage, wherein, the permanent magnet array is arranged in a two-dimension Halbach array.

Figure 4:
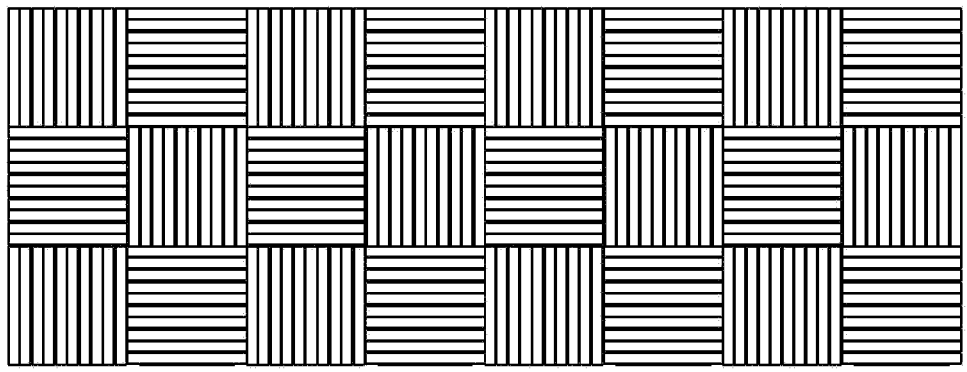
FIG. 4 is a diagram illustrating the arrangement of the coil array of the stator of the moving-iron type planar motor according to the present invention.

FIG. 4 shows the stator 302 of the moving-iron type planar motor of the present invention, and the stator is a coil array mounted on the balance mass 200, wherein, the coils of the coil array are arranged in two directions, i.e., in Y direction and X direction.

Figure 5A:
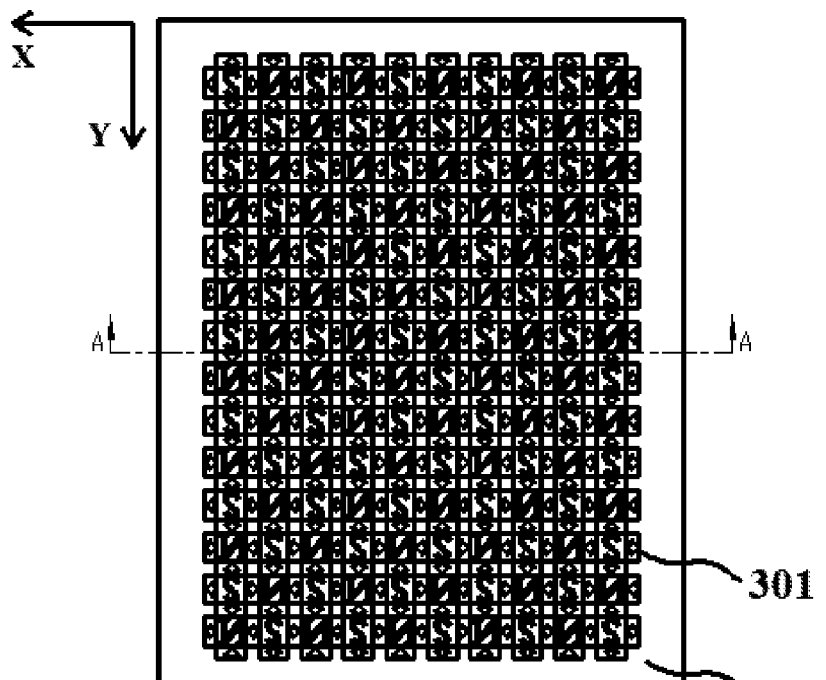
FIG. 5a is a top view illustrating the structure of the movable platform of the magnetically suspended coarse motion and fine motion integrated reticle stage driven by the planar motor according to the present invention.
Figure 5B:
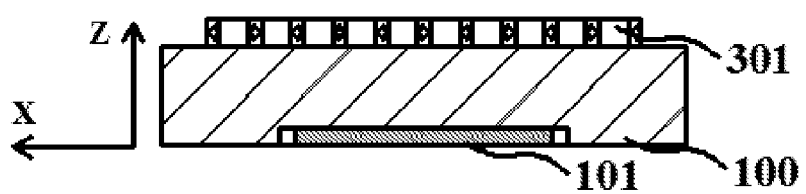

FIG. 5a is a top view illustrating the structure of the movable platform 100 of the magnetically suspended coarse motion and fine motion integrated reticle stage driven by the planar motor according to the present invention, and FIG. 5b is a section view taken along line A-A in FIG. 5a. The coarse motion and fine motion integrated reticle stage 100 utilizes a reflection-type mask plate 101, the movable platform 100 of the coarse motion and fine motion integrated reticle stage has a solid structure, and the mask plate 101 is arranged at the bottom of the movable platform 100 of the coarse motion and fine motion integrated reticle stage.

The invention claimed is:

1. A magnetically suspended coarse motion and fine motion integrated reticle stage driven by a planar motor, comprising a movable platform, a balance mass, a drive motor for the movable platform, a mask plate, a base, a vibration isolation system, and a measurement system,
    wherein the vibration isolation system is located between the balance mass and the base, and the mask plate is mounted on the movable platform, and
    wherein the drive motor for the movable platform is a moving-iron type planar motor, a mover of the moving-iron type planar motor is a permanent magnet array mounted on a top surface of the movable platform, and a stator of the moving-iron type planar motor is a coil array mounted on the balance mass.

2. The magnetically suspended coarse motion and fine motion integrated reticle stage according to claim 1, further comprising a magnetic suspension structure compensating for a weight of the movable platform, and
    wherein a mover of the magnetic suspension structure is mounted on the movable platform, and a stator of the magnetic suspension structure is mounted on the balance mass.

3. The magnetically suspended coarse motion and fine motion integrated reticle stage according to claim 1, wherein the permanent magnet array of the mover of the moving-iron type planar motor is arranged in a two-dimensional Halbach array, and coils of the coil array of the stator of the moving-iron type planar motor are arranged in two perpendicular directions.

4. The magnetically suspended coarse motion and fine motion integrated reticle stage according to claim 1, wherein the mask plate is a reflection-type mask plate, and the mask plate is arranged at a bottom of the movable platform.

* * * * *